United States Patent
Wu et al.

(10) Patent No.: US 10,276,825 B2
(45) Date of Patent: Apr. 30, 2019

(54) ELECTROLUMINESCENT DISPLAY AND ENCAPSULATION METHOD THEREOF

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Shouzheng Wu, Beijing (CN); Qing Zhang, Beijing (CN); Tongmin Liu, Beijing (CN); Heng Zhang, Beijing (CN); Fusheng Huang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/833,508

(22) Filed: Dec. 6, 2017

(65) Prior Publication Data
US 2018/0315954 A1     Nov. 1, 2018

(30) Foreign Application Priority Data
Apr. 28, 2017  (CN) .......................... 2017 1 0296660

(51) Int. Cl.
  *H01L 21/82*   (2006.01)
  *H01L 23/22*   (2006.01)
  (Continued)

(52) U.S. Cl.
  CPC .......... *H01L 51/5246* (2013.01); *H01L 51/56* (2013.01)

(58) Field of Classification Search
  CPC ................................................... H01L 51/5246
  (Continued)

(56) References Cited

U.S. PATENT DOCUMENTS

2014/0042607 A1* 2/2014 Knickerbocker ... H01L 25/0657
257/685

FOREIGN PATENT DOCUMENTS

| CN | 101866943 A | 10/2010 |
| CN | 102270742 A | 12/2011 |

(Continued)

OTHER PUBLICATIONS

CN Office Action for CN Appl. No. 201710296660.2, dated Mar. 2, 2018.

*Primary Examiner* — Calvin Lee
(74) *Attorney, Agent, or Firm* — Foley & Lardner LLP; James F. Ewing; Meng H. Pua

(57) ABSTRACT

The present disclosure discloses an electroluminescent display and the encapsulation method thereof. The electroluminescent display comprises: a substrate having encapsulation units provided on a side surface of the substrate; a cover plate covering the substrate, wherein the cover plate together with the encapsulation units defines a first chamber and a second chamber, the second chamber surrounds the first chamber; an electronic device provided on the substrate and located within the first chamber, wherein the first chamber is filled with inert gas and the second chamber is filled with a hydrophobic liquid. The electroluminescent display according to an embodiment of the present disclosure can prevent water vapor and oxygen from entering the electronic device. The entire system has a good sealing performance, such that a service life of the electronic device can be greatly extended.

14 Claims, 3 Drawing Sheets

(51) Int. Cl.
*H01L 51/52* (2006.01)
*H01L 51/56* (2006.01)

(58) Field of Classification Search
USPC .......................... 257/687, 731; 438/112, 124
See application file for complete search history.

(56) References Cited

FOREIGN PATENT DOCUMENTS

| | | | | |
|---|---|---|---|---|
| CN | 202455440 | * | 3/2012 | ............ G03B 17/02 |
| CN | 103346268 A | | 10/2013 | |
| CN | 103474561 A | | 12/2013 | |
| CN | 103872264 A | | 6/2014 | |
| CN | 103947292 A | | 7/2014 | |
| CN | 105185922 A | | 12/2015 | |
| CN | 106206214 A | | 12/2016 | |

* cited by examiner

ELECTROLUMINESCENT DISPLAY AND ENCAPSULATION METHOD THEREOF

CROSS-REFERENCE TO RELATED APPLICATION

The present application claims priority to Chinese Patent Application No. 201710296660.2 filed on Apr. 28, 2017, titled "ELECTROLUMINESCENT DISPLAY AND ENCAPSULATION METHOD THEREOF", the disclosure of which is incorporated by reference herein in its entirety.

FIELD OF THE DISCLOSURE

The present disclosure relates to the field of display, and particularly to an electroluminescent display and the encapsulation method thereof.

BACKGROUND

In the field of displaying, organic light emitting diode (OLED) devices have a bright future. However, OLED devices are very sensitive to water vapor and oxygen. Water vapor and oxygen, if penetrating into the OLED devices, may chemically react with organic materials, which may result in failure of the OLED devices. For example, when an OLED is in an operation state, if water vapor penetrates into the device, there may form a micro electrolytic cell within the device and an electrochemical reaction may occur. The resulting reaction gas may separate the metal cathode from the organic functional layer, thereby leading to device failure. Thus, water vapor and oxygen that penetrate into a OLED device are main factors that affect a service life of the OLED device.

SUMMARY

The present disclosure aims to solve at least one of the technical problems existing in the prior art. For this purpose, the present disclosure discloses an electroluminescent display, which has a good sealing performance and high operational reliability.

The present disclosure further provides an encapsulation method of the electroluminescent display.

The electroluminescent display according to a first aspect of the present disclosure comprises: a substrate having encapsulation units provided on a side surface of the substrate; a cover plate covering the substrate, wherein the cover plate together with the substrate and the encapsulation units defines a first chamber and a second chamber, and the second chamber surrounds the first chamber; and an electronic device provided on the substrate and located within the first chamber, wherein the first chamber is filled with inert gas and the second chamber is filled with a hydrophobic liquid.

According to an electroluminescent display of an embodiment of the present disclosure, through providing a first chamber and a second chamber and filling inert gas in the first chamber and filling hydrophobic liquid in the second chamber, independent gas sealing and liquid sealing are realized for the electronic device so as to prevent water vapor and oxygen from damaging the electronic device, such that a sealing performance of the entire system is improved and a service life of the electronic device is greatly extended.

According to an electroluminescent display of an embodiment of the present disclosure, the second chamber forms a ring chamber extending along the periphery of the first chamber. Through forming the second chamber as the ring chamber, a gas sealing and a liquid sealing are realized for the electronic device along a periphery of the electronic device.

Optionally, the second chamber comprises a plurality of second chambers that are spaced apart, wherein the plurality of second chambers surround the first chamber from outside to inside, facilitating realizing a multi-layer liquid sealing and further improving the sealing performance of the system.

According to a particular embodiment of the present disclosure, the encapsulation units comprise: a first encapsulation unit surrounding the electronic device and defining, together with opposing surfaces of the substrate and the cover plate, the first chamber; a second encapsulation unit surrounding the first encapsulation unit, wherein the second encapsulation unit, together with the first encapsulation unit and the opposing surfaces of the substrate and the cover plate, defines the second chamber.

Optionally, the first encapsulation unit may comprise at least one first opening that communicates with the first chamber, and the first encapsulation unit may be provided with a first closure unit for closing the first opening. Thus, the first chamber and the second chamber can be separated.

Optionally, the second encapsulation unit comprises at least one second opening that communicates with the second chamber, and the second encapsulation unit is provided with a second closure unit for closing the second opening to seal the second chamber.

According to an embodiment of the present disclosure, a plurality of fins is provided on opposing side surfaces of the first encapsulation unit and the second encapsulation unit. In an optional example, the fins are spaced and distributed along a periphery of the second chamber. Through providing fins on the first encapsulation unit and/or the second encapsulation unit, a certain resistance can be formed against the hydrophobic liquid that is filled into the second chamber to ensure that an amplitude of movement of the internal liquid is limited to a minimum value during a transport process.

An embodiment according to the present disclosure is characterized in that each fin obliquely extends to an inflow direction of the liquid oil with respect to a normal direction of the encapsulation unit, so as to facilitate reverse flow resistance.

According to an embodiment of the present disclosure, the encapsulation units are produced via a screen printing process. Through producing the encapsulation units via a screen printing process, the manufacturing process can be simplified with simple operations.

According to an embodiment of the present disclosure, the hydrophobic liquid is a lipid.

In an embodiment according to a second aspect of the present disclosure, an encapsulation method of the electroluminescent display according to the embodiment of the first aspect of the present disclosure is provided, the method comprising following steps: providing a substrate, wherein the substrate is provided with an electronic device; providing, on the substrate, a first encapsulation unit surrounding the electronic device and a second encapsulation unit surrounding the first encapsulation unit; providing a cover plate, the cover plate covering the substrate to form, among the substrate, the cover plate and the first encapsulation unit, a first chamber within which the electronic device is provided, and to form, among the substrate, the cover plate and the second encapsulation unit, a second chamber surrounding the first chamber; filling the first chamber with inert gas and sealing the first chamber; filling the second chamber with a hydrophobic liquid and sealing the second chamber.

The encapsulation method of the electroluminescent display according to the embodiment of the present disclosure has a simple manufacturing process, a good sealing performance, and a stable and reliable operation performance, and thus can greatly extend a service life of the electroluminescent display.

According to an embodiment of the present disclosure, each of the first and second encapsulation units are provided with an opening. Thus, the first chamber may be communicated with the second chamber via the opening on the first encapsulation unit, and the second chamber may be communicated with the outside via the opening on the second encapsulation unit.

In the encapsulation method of the electroluminescent display according to the embodiment of the present disclosure, the opening on the first encapsulation unit is sealed using a sealant after the first chamber is filled with the inert gas, and the opening on the second encapsulation unit is sealed using a sealant after the second chamber is filled with the hydrophobic liquid.

In the encapsulation method of the electroluminescent display according to the embodiment of the present disclosure, the encapsulation units are produced via a printing process. Through producing the encapsulation units via a printing process, the manufacturing process can be simplified with simple operations.

Additional aspects and advantages of the disclosure will partly be presented in the following description, partly become apparent from the following description or be appreciated in practicing the disclosure.

DESCRIPTION OF THE DRAWINGS

The above and/or additional aspects and advantages of the disclosure will become apparent or readily understood from the following detailed description taken in conjunction with the accompanying drawings, wherein.

Figure 1:
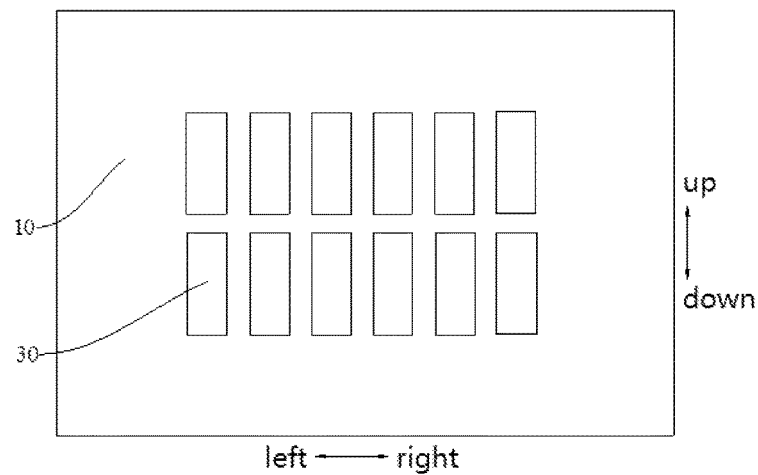
FIG. 1 is a schematic view showing a layout of an electronic device of an electroluminescent display on a substrate according to an embodiment of the present disclosure.

REFERENCE NUMBERS electroluminescent display 100,
substrate 10, cover plate 20, electronic device 30,
first chamber 40, first encapsulation unit 41, first opening 42, first closure unit 43,
second chamber 50, second encapsulation unit 51, second opening 52, second closure unit 53, fin 54.

DETAILED DESCRIPTION

A detailed description of embodiments of the present disclosure will be given below. Examples of the described embodiments are shown in the drawings, throughout which similar reference numerals are used to represent the same or similar elements or elements having the same or similar functions. The embodiments described below with reference to the drawings are illustrative, which are merely intended to explain the present disclosure, but should not be taken as a limitation to the present disclosure.

In the description of the present disclosure, it is to be understood that the azimuth or positional relationship indicated by the terms "upper", "lower" and the like is based on the azimuth or positional relationship shown in the drawings, and is merely for the purpose of facilitating and simplifying the description of the disclosure, rather than indicating or implying that the device or element referred to must have a specific orientation or constructed and operated in a particular orientation, and therefore cannot be construed as limiting the disclosure. In addition, features defined by "first", "second" may expressly or implicitly include one or more of the features. Unless otherwise indicated, the phrase "a plurality of" in this description means "two or more".

In the description of the present disclosure, it should be noted that the terms "mount", "interconnect", "connection" should be broadly understood, unless otherwise specified and defined. For example, a "connection" may be a fixed connection, a removable connection, or an integral connection; or a mechanical connection, or an electrical connection; or a direct connection, or an indirect connection with an intermediate medium, or an internal communication between two elements. For those of ordinary skill in the art, the specific meanings of the above terms in this disclosure can be interpreted according to particular situations.

An electroluminescent display 100 according to an embodiment of the present disclosure will be described below with reference to FIGS. 1 to 6.

As shown in FIGS. 1 to 6, an electroluminescent display 100 according to an embodiment of the present disclosure comprises a substrate 10, a cover plate 20, and electronic device(s) 30.

Encapsulation units are provided on a side surface of the substrate 10. A cover plate 20 covers the substrate 10. The cover plate 20, together with the substrate 10 and the encapsulation units, defines a first chamber 40 and a second chamber 50. The second chamber 50 extends along a periphery of the first chamber 40. An electronic device 30 is provided on the side surface of the substrate 10 and is located within the first chamber 40. Further, the first chamber 40 is filled with inert gas, and the second chamber 50 is filled with liquid oil.

In the electroluminescent display 100 according to an embodiment of the present disclosure, through providing a first chamber 40 and a second chamber 50 and filling the first chamber with inert gas and filling the second chamber with liquid oil, independent gas sealing and liquid sealing are realized for an electronic device 30 to isolate water vapor and oxygen outside and prevent the water vapor and oxygen from damaging the electronic device 30, such that a sealing performance of the entire system is improved and a service life of the electronic device 30 is extended.

In the electroluminescent display 100 according to an embodiment of the present disclosure, the second chamber 50 forms a ring chamber extending along a periphery of the first chamber 40. The second chamber 50 is formed in a ring shape. The first chamber 40 is filled with inert gas and the second chamber 50 is filled with liquid oil, such that a gas sealing and a liquid sealing are realized for the electronic device 30 along a periphery of the electronic device 30.

In some embodiments, the second chamber 50 may comprise a plurality of spaced second chambers 50, each second chamber 50 forming a ring chamber and the plurality of second chambers 50 surrounding the first chamber 40 from outside to inside. In this manner, through surrounding a periphery of the first chamber 40 with a plurality of second chambers 50, a multiple-level liquid sealing can be realized for the electronic device 30, which further improves the sealing performance of the system.

According to a particular embodiment of the present disclosure, the encapsulation units comprise: a first encapsulation unit 41, and a second encapsulation unit 51 extending along a periphery of the first encapsulation unit 41.

The first encapsulation unit 41 extends along a periphery of a region where the electronic device 30 is located. The first encapsulation unit 41, together with opposing surfaces of the substrate 10 and the cover plate 20, defines the first chamber 40. The second encapsulation unit 51 is disposed on the outside of the first encapsulation unit 41. The second encapsulation unit 51, together with the first encapsulation unit 41 and the opposing surfaces of the substrate 10 and the cover plate 20, defines the second chamber 50. Through providing two encapsulation units on the substrate 10, two chambers that accommodate inert gas and liquid oil respectively are defined to facilitate realization of an internal gas sealing and an external liquid sealing that are independent.

Further, the first encapsulation unit 41 has a first opening 42 that communicates with the first chamber 40. There may be one or more first openings 42. The first encapsulation unit 41 is provided with a first closure unit 43 for closing the first opening 42, so as to facilitate separating the first chamber 40 and the second chamber 50 into independent chambers after filling the first chamber 40 with inert gas.

Similarly, the second encapsulation unit 51 has a second opening 52 that communicates with the second chamber 50. There may be one or more second openings 52. The second encapsulation unit 51 is provided with a second closure unit 53 for closing the second opening 52, so as to facilitate sealing the second chamber 50 with the second encapsulation unit 51 after filling the second chamber 50 with liquid oil, such that the second chamber 50 is isolated from the outside to prevent water vapor and oxygen from entering the system from the outside.

In some embodiments, a plurality of spaced fins 54 are provided on opposing side surfaces of the first encapsulation unit 41 and the second encapsulation unit 51 along a periphery of the second chamber 50, so as to facilitate stabilizing a flow of the liquid oil.

It should be understood that the fins 54 may be provided on a side surface of the first encapsulation unit 41 that is opposite to the second encapsulation unit 51, or may be provided on a side surface of the second encapsulation unit 51 that is opposite to the first encapsulation unit 41, or may be provided on side surfaces of the first encapsulation unit 41 and the second encapsulation unit 51 that are opposite to each other. This is not limited by the present disclosure.

Figure 2:
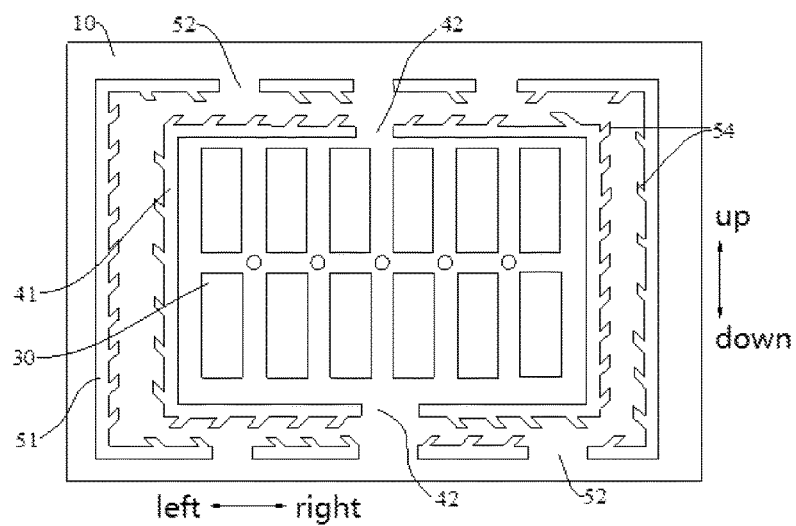
FIG. 2 is a schematic view showing a layout of encapsulation units of an electroluminescent display on a substrate according to an embodiment of the present disclosure.

In some embodiments, each fin 54 obliquely extends, with respect to a normal direction of the encapsulation units, to an inflow direction of the liquid oil. In the present disclosure, a normal direction of an encapsulation unit refers to a direction perpendicular to a surface of the encapsulation unit. For different part of the encapsulation unit, the normal direction thereof may be different. For example, in case the section of the first encapsulation unit 41 is a rectangle as shown in FIG. 2, the normal direction for the left and right surfaces of the first encapsulation unit 41 is the horizontal direction (i.e. along the left and right direction) in FIG. 2, and the normal direction for the upper and lower surfaces of the first encapsulation unit 41 is the vertical direction (i.e. up and down direction) in FIG. 2. Therefore, the normal direction of the encapsulation unit does not refer to a fixed direction, and it may change in accordance with the orientation of the surfaces of the encapsulation unit.

As shown in FIGS. 2-5, in some specific embodiments, each of the first encapsulation unit 41 and the second encapsulation unit 51 is substantially in a rectangular shape, wherein the second encapsulation unit 51 is provided with a plurality of second openings 52 in its upper and lower encapsulation sections.

A fin 54 on the left side of a second opening 52 (opening a) in a lower encapsulation section of the second encapsulation unit 51 obliquely extends to the left with respect to a normal direction of the encapsulation unit, while a fin 54 on the right side of the opening a obliquely extends to the right with respect to the normal direction of the encapsulation unit. The fins 54 on the left and right sides of the second chamber 50 obliquely extend upwards with respect to the normal direction of the encapsulation unit. A fin 54 on the left side of a second opening 52 (opening b) in an upper encapsulation section of the second encapsulation unit 51 obliquely extends to the right with respect to a normal direction of the encapsulation unit, while a fin 54 on the right side of the opening b obliquely extends to the left with respect to the normal direction of the encapsulation unit.

The liquid oil is filled upwards into the second chamber 50 from the opening a and flows towards both sides of the opening respectively. Since the plurality of fins 54 on the first encapsulation unit 41 and the second encapsulation unit 51 always extend, with respect to a normal direction of the encapsulation section in a corresponding position, to an inflow direction of the liquid oil, reverse flow resistance of the liquid oil can be prevented while the flow speed of the is also controlled. Certainly, the liquid oil may also be filled from other second opening 52, which is not limited in the present disclosure.

In some embodiments, the encapsulation units are produced via a screen printing process. The manufacturing is convenient and easy.

According to an embodiment of the present disclosure, the liquid oil may be a hydrophobic liquid. For example, a lipid in which oxygen and water are insoluble can be used to prevent a chemical reaction between the water vapor/oxygen and the organic materials, thereby avoiding damage to the electronic device 30 and failure of the electronic device 30.

An encapsulation method of an electroluminescent display 100 according to an embodiment of a second aspect of the present disclosure will be described below with reference to FIGS. 1 to 6.

An encapsulation method of the electroluminescent display 100 according to an embodiment of the present disclosure comprises steps of:

S1. Providing a substrate, wherein the substrate is provided with an electronic device;

S2. Providing, on the substrate, a first encapsulation unit surrounding the electronic device and a second encapsulation unit surrounding the first encapsulation unit;

S3. providing a cover plate, the cover plate covering the substrate to define, among the substrate, the cover plate and the first encapsulation unit, a first chamber within which the electronic device is provided, and to define, among the substrate, the cover plate and the second encapsulation unit, a second chamber surrounding the first chamber;

S4. filling the first chamber with inert gas, and sealing the first chamber;

S5. filling the second chamber with liquid oil, and sealing the second chamber.

The encapsulation method of the electroluminescent display 100 according to the embodiment of the present disclosure has a simple manufacturing process. Through using internally and externally independent gas sealing and liquid sealing, the sealing performance of the entire system is improved. Compared with the prior art, it does not need to produce a separate encapsulation layer for each electronic device 30, such that the process difficulty is reduced. Meanwhile, a function of sealing performance detection is also provided, enabling conducting encapsulation and detection simultaneously, which improves the encapsulation quality. Further, the sealing is stable and reliable, and thus a service life of the electroluminescent display 100 can be greatly extended.

As shown in FIGS. 1 to 6, in the present embodiment, firstly, a substrate 10 (the structure shown in FIG. 1) with an electronic device 30 is manufactured via a regular process.

Secondly, encapsulation units (the structure shown in FIG. 2) are provided on the substrate 10. There are at least two loops of encapsulation units surrounding the electronic device 30, for example, a first encapsulation unit 41 and a second encapsulation unit 51 shown in FIG. 2. The first encapsulation unit 41 is provided with at least one first opening 42 to communicate the first chamber 40 with the second chamber 50 to facilitate filling the first chamber 40 with inert gas. The second encapsulation unit 51 is provided with at least one second opening 52 to communicate the second chamber 50 with the outside to facilitate filling the second chamber 50 with liquid oil. The encapsulation units may be produced via a screen printing process, which is simple and convenient.

Further, a plurality of fins 54 spaced along a periphery of the second chamber 50 are provided on opposing side surfaces of the first encapsulation unit 41 and the second encapsulation unit 51. As described above, the direction of the fins 54 can be oblique to the inflow direction of the liquid with respect to the normal direction of surfaces of the encapsulation units. Thus, the fins 54 are used to "fix" the liquid oil, only allowing the liquid oil to move in a predetermined direction and obstructing the liquid oil to move in the reverse direction. This ensures that an amplitude of movement of the internal liquid is limited to a minimum during a transport process, which may improve a sealing performance and product reliability.

Figure 3:
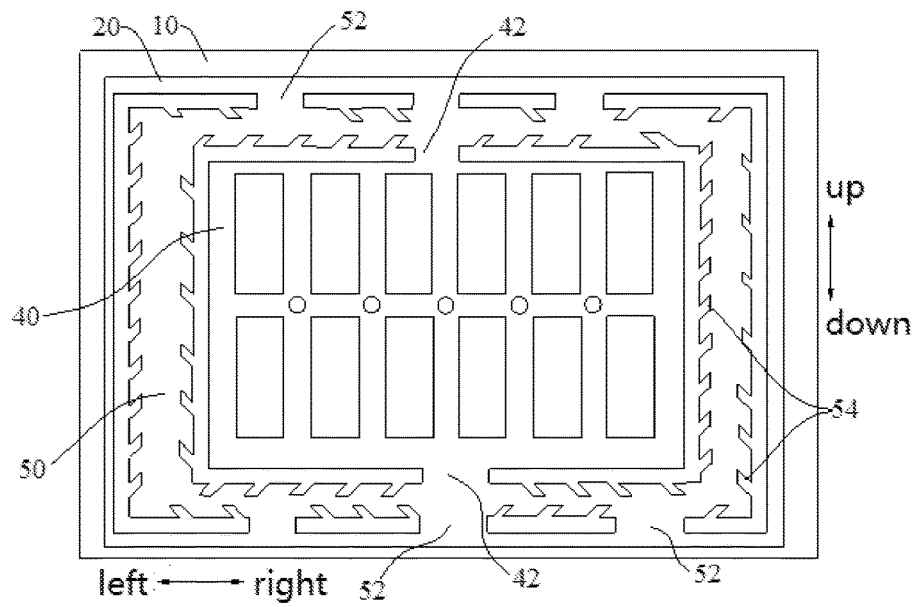
FIG. 3 is a schematic view showing a layout of a first chamber and a second chamber of an electroluminescent display according to an embodiment of the present disclosure.

Thirdly, a cover plate 20 is attached to obtain the structure as shown in FIG. 3. At this point, a first chamber 40 and a second chamber 50 separated by the first and second encapsulation units are formed between the cover plate 20 and the substrate 10. The encapsulation units between the cover plate 20 and the substrate 10 may support and secure the cover plate 20 by adhesion.

Figure 4:
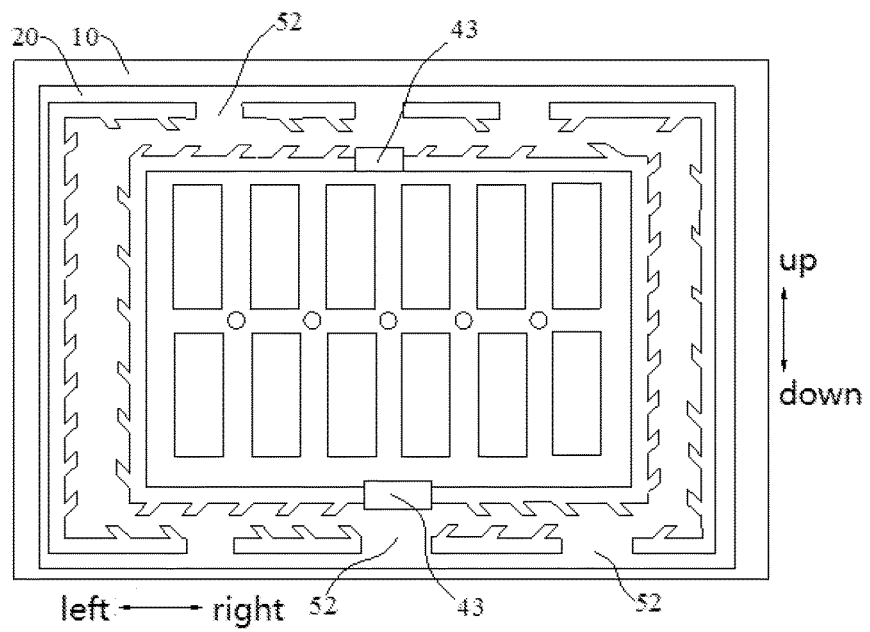
FIG. 4 is a structure diagram of the first chamber shown in FIG. 3 after encapsulation.

Fourthly, the first chamber 40 is filled with dry inert gas. After the pressure in the first chamber 40 reaches a predetermined value, the first opening 42 in a region where the electronic device 30 is located is closed by a first closure unit 43 (for example, a sealant) so as to seal the first chamber 40, resulting in the structure as shown in FIG. 4. This closing operation is simple and has a good sealing performance.

After the dry inert gas is encapsulated into the first chamber 40 where the electronic device 30 is located, the electronic device 30 will be in an oxygen-free and dry environment. After such an encapsulation, it can be checked whether the effect of sealing meets a requirement by setting a negative pressure for the external environment and detecting the environmental inert gas content. In the present disclosure, the inert gas refers to gases that do not have a reaction with the internal environment of the first chamber 40. For example, the inert gas may includes at least one of: nitrogen, carbon dioxide, helium, neon, krypton, xenon, etc. In an embodiment of the present disclosure, the inert gas is a colorless and transparent gas. In another embodiment of the present disclosure, the dry inert gas may be filled from bottom to top during the filling process. In a further embodiment of the present disclosure, the inert gas is an inert gas with a density greater than the density of the air.

Figure 5:
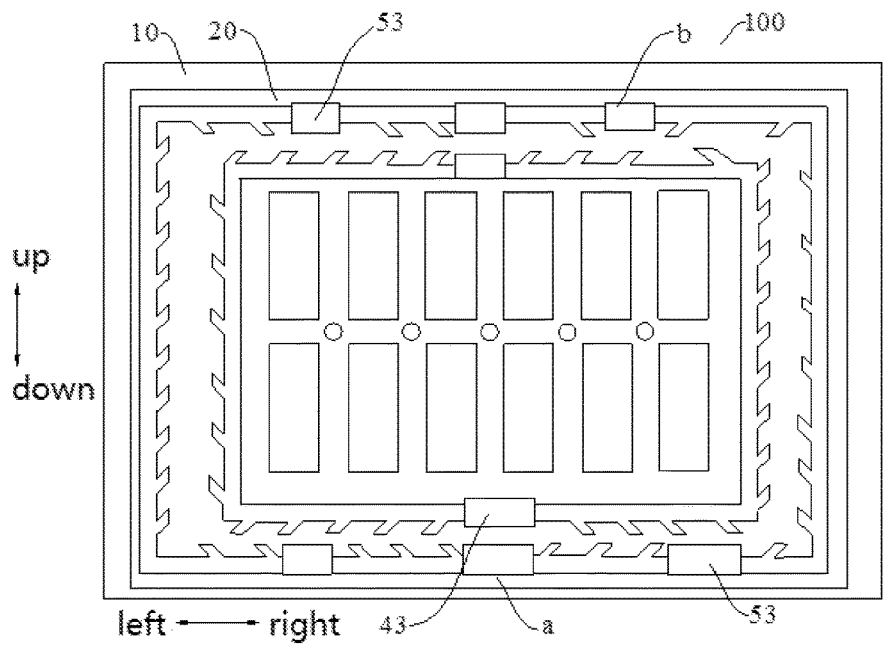
FIG. 5 is a structure diagram of the second chamber shown in FIG. 3 after encapsulation.
Figure 6:
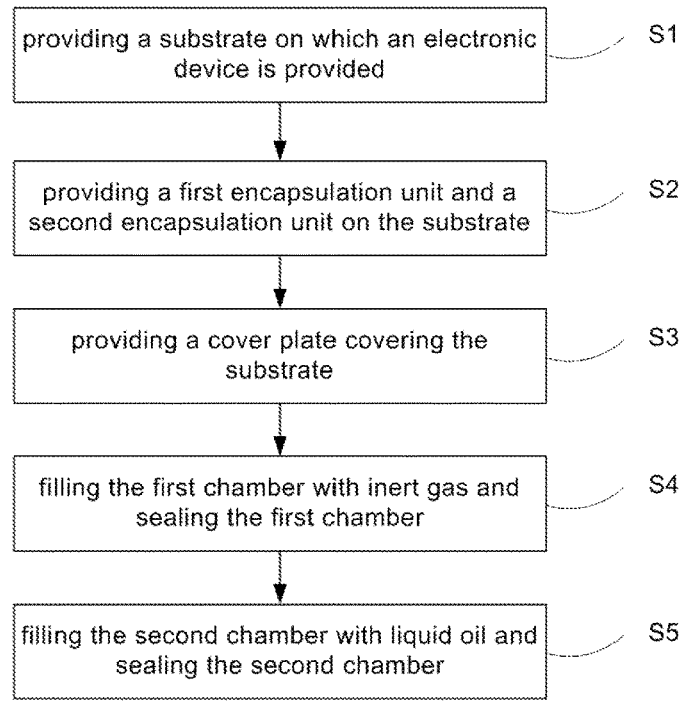
FIG. 6 is a flow chart of an encapsulation method of an electroluminescent display according to an embodiment of the present disclosure.

In the end, the second chamber 50 is filled with liquid oil. After the second chamber 50 is fully filled, the second opening 52 is sealed with a second closure unit 53 (for example, a sealant) so as to close the second chamber 50. The resulting structure is shown in FIG. 5. At this point, the entire encapsulation process is completed. To ensure liquid oil movement in the chamber and better filling of related chamber(s), a lipophilic hydrophobic material can be used as the liquid oil. Further, the liquid oil is a macromolecular compound such as a lipid, ensuring that the liquid oil cannot easily enter the region where the electronic device 30 is located.

Therefore, with the above encapsulation method, a sealed space is formed by the surrounding gas and liquid in a peripheral region of the electronic device 30. Since the oily substance itself is hydrophobic and cannot be blended with water, outside water vapor cannot enter the region where the electronic device 30 is located and cause damage to the device. The encapsulation unit(s) may form interconnected structures with some blocks therebetween by the fins, ensuring a minimum movement of the oily substance during subsequent use.

In some embodiments, in order to further improve the protection capability, three or more layers of encapsulation units can be provided to form a plurality of chambers that provide better protection for the electronic device 30.

Other compositions and operations of the encapsulation method of the electroluminescent display 100 according to an embodiment of the present disclosure are known to those skilled in the art and will not be described in detail herein.

Throughout the description of the specification, description referring to terms such as "one embodiment", "some embodiments", "illustrative embodiments", "examples", "specific examples", or "some examples" and the like means that a specific feature, structure, material or characteristic described in connection with the embodiment(s) or example(s) is included in at least one embodiment or example of the present disclosure. Therefore, illustrative expressions with respect to the above terms in the specification are not necessarily referring to the same embodiment or example. Furthermore, the specific feature(s), structure(s), material(s) or characteristic(s) may be combined in a suitable manner in one or more embodiments or examples of the disclosure.

Although the embodiments of the present disclosure have been illustrated and described, it will be understood by those skilled in the art that various changes, modifications, substitutions and variations may be made to these embodiments without departing from the spirit or principle of the disclosure. The scope of the present disclosure is defined by the claims and their equivalents.

The invention claimed is:

1. An encapsulation method of an electroluminescent display, comprising steps of:
   providing a substrate, wherein the substrate is provided with an electronic device;
   providing, on the substrate, a first encapsulation unit surrounding the electronic device and a second encapsulation unit surrounding the first encapsulation unit;
   providing a cover plate, the cover plate covering the substrate to form, among the substrate, the cover plate and the first encapsulation unit, a first chamber within which the electronic device is provided, and to form, among the substrate, the cover plate and the second encapsulation unit, a second chamber surrounding the first chamber;
   filling the first chamber with inert gas and sealing the first chamber; and
   filling the second chamber with a hydrophobic liquid and sealing the second chamber.

2. The encapsulation method according to claim 1, wherein the first and second encapsulation units are produced via a screen printing process.

3. The encapsulation method according to claim 1, wherein each of the first and second encapsulation units are provided with an opening.

4. The encapsulation method according to claim 3, wherein the opening on the first encapsulation unit is sealed using a sealant after the first chamber is filled with the inert gas, and the opening on the second encapsulation unit is sealed using a sealant after the second chamber is filled with the hydrophobic liquid.

5. An electroluminescent display, comprising:
   a substrate having encapsulation units provided on a side surface of the substrate;
   a cover plate covering the substrate, wherein the cover plate, together with the substrate and the encapsulation units, defines a first chamber and a second chamber, and the second chamber surrounds the first chamber; and
   an electronic device provided on the substrate and located within the first chamber,
   wherein the first chamber is filled with an inert gas and the second chamber is filled with a hydrophobic liquid.

6. The electroluminescent display according to claim 5, wherein the second chamber comprises a plurality of second chambers that are spaced apart.

7. The electroluminescent display according to claim 5, wherein the encapsulation units are produced via a screen printing process.

8. The electroluminescent display according to claim 5, wherein the hydrophobic liquid is a lipid.

9. The electroluminescent display according to claim 5, wherein the second chamber forms a ring chamber extending along a periphery of the first chamber.

10. The electroluminescent display according to claim 9, wherein the encapsulation units comprise:
    a first encapsulation unit surrounding the electronic device and defining, together with opposing surfaces of the substrate and the cover plate, the first chamber;
    a second encapsulation unit surrounding the first encapsulation unit, wherein the second encapsulation unit, together with the first encapsulation unit and the opposing surfaces of the substrate and the cover plate, defines the second chamber.

11. The electroluminescent display according to claim 10, wherein the second encapsulation unit comprises at least one second opening that communicates with the second chamber, and the second encapsulation unit is provided with a second closure unit for closing the second opening to seal the second chamber.

12. The electroluminescent display according to claim 10, wherein the first encapsulation unit comprises at least one first opening that communicates with the first chamber, and the first encapsulation unit is provided with a first closure unit for closing the at least one first opening.

13. The electroluminescent display according to claim 10, wherein a plurality of fins are provided on opposing side surfaces of the first encapsulation unit and the second encapsulation unit.

14. The electroluminescent display according to claim 13, wherein each fin obliquely extends to an inflow direction of liquid oil with respect to a normal direction of the encapsulation units.

* * * * *